(12) United States Patent
Kobayashi

(10) Patent No.: US 8,106,577 B2
(45) Date of Patent: Jan. 31, 2012

(54) ORGANIC EL DEVICE AND ELECTRONIC APPARATUS

(75) Inventor: Hidekazu Kobayashi, Toyoshina-machi (JP)

(73) Assignee: Seiko Epson Corporation, Tokyo (JP)

( * ) Notice: Subject to any disclaimer, the term of this patent is extended or adjusted under 35 U.S.C. 154(b) by 196 days.

(21) Appl. No.: 12/470,845

(22) Filed: May 22, 2009

(65) Prior Publication Data

US 2009/0230858 A1 Sep. 17, 2009

Related U.S. Application Data

(63) Continuation of application No. 11/141,495, filed on Jun. 1, 2005, now Pat. No. 7,573,191.

(30) Foreign Application Priority Data

Jun. 2, 2004 (JP) .................................. 2004-164493
Jun. 2, 2004 (JP) .................................. 2004-164495

(51) Int. Cl.
*H01L 51/50* (2006.01)
*H01L 51/52* (2006.01)

(52) U.S. Cl. .................. 313/501; 313/504; 313/507

(58) Field of Classification Search ........... 313/498–512
See application file for complete search history.

(56) References Cited

U.S. PATENT DOCUMENTS

| | | | |
|---|---|---|---|
| 5,554,911 A | 9/1996 | Nakayama et al. | |
| 6,639,250 B1 | 10/2003 | Shimoda et al. | |
| 6,724,140 B2 | 4/2004 | Araki | |
| 6,737,800 B1 * | 5/2004 | Winters et al. | 313/504 |
| 6,833,668 B1 * | 12/2004 | Yamada et al. | 313/505 |
| 6,958,740 B1 * | 10/2005 | Nishikawa | 345/76 |
| 6,984,461 B2 | 1/2006 | Son et al. | |
| 6,993,214 B2 | 1/2006 | Nishimura et al. | |
| 7,019,331 B2 | 3/2006 | Winters et al. | |
| 7,098,590 B2 | 8/2006 | Lim et al. | |
| 7,531,958 B2 | 5/2009 | Nishikawa et al. | |
| 2002/0038998 A1 * | 4/2002 | Fujita et al. | 313/495 |
| 2002/0190639 A1 | 12/2002 | Yamada et al. | |
| 2003/0156239 A1 | 8/2003 | Inoue et al. | |
| 2004/0195963 A1 * | 10/2004 | Choi et al. | 313/504 |
| 2004/0206960 A1 * | 10/2004 | Nishikawa | 257/72 |
| 2004/0207570 A1 * | 10/2004 | Nishikawa et al. | 345/45 |
| 2004/0258956 A1 * | 12/2004 | Matsusue | 428/690 |
| 2005/0040756 A1 * | 2/2005 | Winters et al. | 313/504 |
| 2005/0067954 A1 | 3/2005 | Nishikawa et al. | |
| 2005/0073230 A1 * | 4/2005 | Nishikawa et al. | 313/111 |
| 2005/0140288 A1 | 6/2005 | Suzuki | |
| 2005/0142976 A1 * | 6/2005 | Suzuki | 445/24 |

(Continued)

FOREIGN PATENT DOCUMENTS

CN 1496206 A 5/2004

(Continued)

*Primary Examiner* — Nimeshkumar Patel
*Assistant Examiner* — Jose M Diaz
(74) *Attorney, Agent, or Firm* — Oliff & Berridge, PLC

(57) ABSTRACT

An organic EL device includes light-reflective electrodes; light-transmissive electrodes; organic EL layers that are respectively provided between the light-reflective electrodes and the light-transmissive electrodes to emit a plurality of color light components, the organic EL layer emitting a different color light component in each pixel; and transflective layers that are selectively provide in predetermined color pixels to reflect or transmit light emitted from the organic EL layers, respectively, each transflective layer being opposite to the light-reflective electrode with the organic EL layer interposed therebetween.

7 Claims, 11 Drawing Sheets

U.S. PATENT DOCUMENTS

| | | |
|---|---|---|
| 2005/0147844 A1 * | 7/2005 | Hatwar et al. ............... 428/690 |
| 2005/0212414 A1 | 9/2005 | Matsusue et al. |
| 2006/0012295 A1 | 1/2006 | Kobayashi |
| 2006/0163582 A1 * | 7/2006 | Lee et al. ................... 257/66 |
| 2007/0102737 A1 | 5/2007 | Kashiwabara et al. |
| 2007/0200983 A9 | 8/2007 | Inoue et al. |
| 2008/0297043 A1 | 12/2008 | Nishikawa et al. |

FOREIGN PATENT DOCUMENTS

| | | |
|---|---|---|
| JP | A-06-275381 | 9/1994 |
| JP | A-08-213174 | 8/1996 |
| JP | A-8-222374 | 8/1996 |
| JP | A-10-255983 | 9/1998 |
| JP | A-2000-268980 | 9/2000 |
| JP | A-2002-299066 | 10/2002 |
| JP | 2003005169 A * | 1/2003 |
| JP | A-2003-508876 | 3/2003 |
| JP | 2003-202587 | 7/2003 |
| JP | A-2004-014335 | 1/2004 |
| JP | A-2004-137456 | 5/2004 |
| JP | A-2004-146067 | 5/2004 |
| JP | A-2004-178930 | 6/2004 |
| JP | A-2004-111398 | 8/2004 |
| JP | A-2005-116516 | 4/2005 |
| JP | A-2005-129510 | 5/2005 |
| JP | A-2005-276662 | 10/2005 |
| JP | A-2007-520862 | 7/2007 |
| KR | 2004-25025 | 3/2004 |

* cited by examiner

ORGANIC EL DEVICE AND ELECTRONIC APPARATUS

CROSS-REFERENCE TO RELATED APPLICATIONS

This is a Continuation of application Ser. No. 11/141,495 filed Jun. 1, 2005, which claims priority from Japanese Patent Application Nos. 2004-164493, filed on Jun. 2, 2004, and 2004-164495, filed on Jun. 2, 2004. The disclosures of the prior applications are hereby incorporated by reference herein in their entirety.

BACKGROUND OF THE INVENTION

1. Technical Field

The present invention relates to an organic EL device and to an electronic apparatus.

2. Related Art

In recent years, organic electroluminescent (hereinafter, referred to as organic EL) devices in which a plurality of organic EL elements, serving as information display units, are provided in each pixel have been used in electronic apparatuses, such as notebook computers, cellular phones, and electronic organizers. In general, the organic EL element has a structure in which an organic functional layer including an organic EL layer (light-emitting layer) is interposed between a pair of electrodes.

For example, Japanese Unexamined Patent Application Publication No. 8-213174 (the related art) discloses an organic EL device having optical resonators in order to compress the half-width of the emission spectrum of the luminescent color from each pixel.

In the organic EL device disclosed in the above-mentioned related art, a transflective layer, a reflective layer, and an organic EL layer, serving as a light-emitting layer, interposed therebetween constitute an optical resonance structure, and this structure makes it possible to compress the spectral half-width of light emitted from the light-emitting layer, to improve luminous efficiency, and to generate coherent light. When optical resonators having the same structure are respectively provided in the respective color pixels, it is difficult to optimize all pixels. This is because, when the structure of the optical resonator is optimized on an emission wavelength to be optimized, the organic EL layers must be formed with different thicknesses in the respective color pixels. In particular, the organic EL layer in the red (R) pixel has to be formed with a larger thickness, which causes an increase in driving voltage and the lowering of efficiency.

Further, in general, the organic EL device has a narrow color chromaticity range. In this case, the power of color expression can be enlarged by introducing an optical resonance structure, but luminous efficiency may be lowered by the introduction of the optical resonance structure.

SUMMARY

An advantage of the invention is that it provides an organic EL device having an optical resonance structure, capable of obtaining high color purity over all colors and of preventing the generation of a defect, such as an increase in the driving voltage, using a structure in which an organic EL layer has a different thickness for each pixel.

Another advantage of the invention is that it provides an organic EL device capable of improving color purity and of preventing luminous efficiency from being reduced, by the introduction of an optical resonance structure. Further, still another advantage of the invention is that it provides an electronic apparatus having high reliability.

According to an aspect of the invention, an organic EL device includes light-reflective electrodes; light-transmissive electrodes; organic EL layers that are respectively provided between the light-reflective electrodes and the light-transmissive electrodes to emit a plurality of color light components, the organic EL layer emitting a different color light component in each pixel; and transflective layers that are selectively provide in predetermined color pixels to reflect or transmit light emitted from the organic EL layers, respectively, each transflective layer being opposite to the light-reflective electrode with the organic EL layer interposed therebetween.

According to the above-mentioned structure, the transflective layer and the light-reflective electrode constitute an optical resonator. Thus, light emitted from the organic EL layer toward the light-reflective electrode is reflected from the light-reflective electrode, and then resonates between the light-reflective electrode and the transflective layer. When the reflected light has a wavelength capable of passing through the transflective layer by the resonance, the reflected light passes through the transflective layer. Meanwhile, a portion of the light emitted from the organic EL layer to the transflective layer passes through the transflective layer, and the other thereof is reflected from the transflective layer, and then resonates between the light-reflective electrode and the transflective layer. When the reflected light has a wavelength capable of passing through the transflective layer by the resonance, the reflected light passes through the transflective layer. As described above, the light passing through the transflective layer is emitted from the organic EL device to contribute to display. However, in this embodiment, since the reflected light passes through the transflective layer after resonance, the color purity of light emitted from the organic EL device is improved.

Further, in the invention, the transflective layers are selectively formed only in predetermined color pixels. However, for example, the transflective layers may be selectively formed in the organic EL layers having relatively lower color purity among the organic EL layers being used. In this case, it is not necessary to make the thicknesses of the organic EL layers different from each other in the respective color pixels in order to correct a difference in color purity. That is, according to the invention, it is possible to reduce the thickness of the organic EL layer in each pixel. As a result, it is possible to prevent or suppress the generation of defects, such as an increase in driving voltage and the lowering of driving efficiency, caused by a thick organic EL layer in the related art. Also, it is possible to prevent the life span of the organic EL layer form being shortened due to a reduction in the thickness of the organic EL layer. Of course, it is not necessary to make the thicknesses of the hole injecting/transporting layers different from each other in the respective color pixels. Therefore, according to the invention, it is possible to provide an organic EL device having a simple structure, high color purity, and excellent IVL characteristic.

Further, it is preferable that the organic EL layers be made of an organic EL material to emit red, green, blue light components, and that the transflective layers be selectively provided in the green and blue pixels. As such, when the organic EL layers are made of a polymer material, the color purity of red becomes relatively larger than those of green and blue. Therefore, as described above, when the organic EL layers are selectively provided in the green and blue pixels, the whole color purity of each color can be improved. In this case, as described above, it is not necessary to decrease or increase the thickness of the organic EL layer having a specific color (in this case, red). Therefore, it is possible to prevent or suppress the generation of defects, such the lowering of driving efficiency, as an increase in driving voltage caused by an increase in the thickness of the organic EL layer, and a reduction in life span caused by a decrease in the thickness of the organic EL layer.

Furthermore, in the above-mentioned structure, it is preferable that red absorption filters that absorb the red light component be selectively provided at light emission sides of the transflective layers in the green and blue pixels, respectively. In this case, even if, for example, a polarizing plate is not provided on a light emission side (on a display surface) of the organic EL device, it is possible to solve the problem of light reflected from the transflective layer being emitted from the organic EL device. Therefore, it is possible to provide an organic EL device having an excellent IVL characteristic and high contrast and color purity.

Moreover, it is preferable that the light-transmissive electrodes be formed on a predetermined light-transmissive substrate, and that the red absorption filters be also formed on the light-transmissive substrate. According to this structure, unlike the related art in which filters are provided on the outer surface of a substrate, the deviation between the filters and pixels by the viewing angle does not occur, and thus the effect of the filter can be sufficiently exhibited. In addition, the introduction of the red absorption filters makes it possible to solve the problem of unevenness being generated on the outer surface of the organic EL device, and the absorption filters can be protected by the light-transmissive substrate.

Further, it is preferable that the transflective layer also serve as an electrode, that a light-transmissive auxiliary electrode be formed on a light emission side of the transflective layer, and that the red absorption filter be formed by mixing a red absorption component into the auxiliary electrode. In this case, unlike the related art in which the filters are provided on the outer surface of the substrate, the deviation between the filters and pixels by the viewing angle does not occur, and thus the effect of the filter can be sufficiently exhibited. In addition, the introduction of the red absorption filters makes it possible to solve the problem of unevenness being generated on the outer surface of the organic EL device, and the absorption filters can be protected by the light-transmissive substrate. Further, since the red absorption filters are not provided separately, it is possible to reduce the size of the organic EL device.

Furthermore, according to another aspect of the invention, an organic EL device includes light-reflective electrodes; light-transmissive electrodes; organic EL layers that are respectively provided between the light-reflective electrodes and the light-transmissive electrodes to emit a plurality of color light components, the organic EL layer emitting a different color light component in each pixel; and transflective layers that reflect or transmit light emitted from the organic EL layers, each transflective layer being opposite to the light-reflective electrode with the organic EL layer interposed therebetween. In the organic EL device, the transflective layers have different reflectances in the pixels emitting different color light components.

According to the above-mentioned structure, the transflective layer and the light-reflective electrode constitute an optical resonator. Thus, light emitted from the organic EL layer toward the light-reflective electrode is reflected from the light-reflective electrode, and then resonates between the light-reflective electrode and the transflective layer. When the reflected light has a wavelength capable of passing through the transflective layer by the resonance, the reflected light passes through the transflective layer. Meanwhile, a portion of the light emitted from the organic EL layer to the transflective layer passes through the transflective layer, and the other thereof is reflected from the transflective layer, and then resonates between the light-reflective electrode and the transflective layer. When the reflected light has a wavelength capable of passing through the transflective layer by the resonance, the reflected light passes through the transflective layer. As described above, the light passing through the transflective layer is emitted from the organic EL device to contribute to display. However, in this embodiment, since the reflected light passes through the transflective layer after resonance, the color purity of light emitted from the organic EL device is improved.

Furthermore, in the invention, the reflectances of the transflective layers are different from each other in the pixels having different colors. Therefore, it is possible to form the transflective having relatively higher reflectances in the pixels including the organic EL layers that have relatively lower color purity among the organic EL layers being used. On the other hand, it is possible to form the transflective layers having relatively lower reflectances in the pixels including the organic EL layers that have relatively higher color purity. According to this structure, it possible to prevent the lowering of luminous efficiency caused by the introduction of the transflective layer 326 to the minimum, while maintaining the effect of improving color purity by the introduction of the transflective layers.

Moreover, it is preferable that the organic EL layers be made of a polymer material to emit red, green, and blue light components, and that the occupation areas of the transflective layers in plan view be set in the pixels to satisfy the following relationship: (the occupation area of the transflective layer in the red pixel)<(the occupation area of the transflective layer in the green pixel)<(the occupation area of the transflective in the blue pixel).

When the organic EL layers are made of a polymer organic EL material, in general, the color purity of red can be raised greater than those of green and blue, while the color purities of green and blue (particularly blue) is smaller than that of red. Therefore, as described above, when the reflectance of the transflective layer in the red pixel is lower than those of the green and blue pixels while the reflectances of the green and blue pixels are higher than that of the red pixel, it is possible to uniformly raise the color purities of the respective color pixels. As such, when the transflective layer is formed in the red pixel having high color purity to have low reflectance while uniformly raising the color purity, it is possible to appropriately prevent the lowering of luminous efficiency.

Moreover, it is possible to make the reflectances of the transflective layers different from each other for every pixel by making the occupation areas of the transflective layers in plan view different from each other in the pixels emitting different color light components. In this case, it is preferable that the organic EL layers be made of a polymer material to emit red, green, and blue light components, and that the occupation areas of the transflective layers in plan view be set in the pixels to satisfy the following relationship: (the occupation area of the transflective layer in the red pixel)<(the occupation area of the transflective layer in the green pixel)<(the occupation area of the transflective in the blue pixel).

As described above, the organic EL device of the invention is characterized in that the transflective layers have high reflectance in the order of red, green, and blue. For example, the transflective layer may not be provided in the red pixel. That is, in the organic EL device of the invention, the transflective layers can be selectively provided in the green and blue pixels.

Further, it is preferable that red absorption filters that absorb the red light component be provided at light emission sides of the transflective layers in the green and blue pixels, respectively. In this case, even if, for example, a polarizing plate is not provided on a light emission side (on a display surface) of the organic EL device, it is possible to solve the problem of light reflected from the transflective layer being emitted from the organic EL device. Therefore, it is possible to provide an organic EL device having an excellent IVL characteristic and high contrast and color purity. In addition, the light-transmissive electrodes can be formed on a predetermined light-transmissive substrate, and the red absorption filters can also be formed on the light-transmissive substrate. In this case, the introduction of the red absorption filters makes it possible to solve the problem of unevenness being generated on the outer surface of the organic EL device, and the absorption filters can be protected by the light-transmissive substrate.

Furthermore, according to still another aspect of the invention, an electronic apparatus includes the above-mentioned organic EL device as a display unit. Thus, the electronic apparatus can display an image having high color purity and contrast.

BRIEF DESCRIPTION OF THE DRAWINGS

The invention will be described with reference to the accompanying drawings, wherein like numbers reference like elements, and wherein.

DESCRIPTION OF THE EMBODIMENTS

Figure 1:
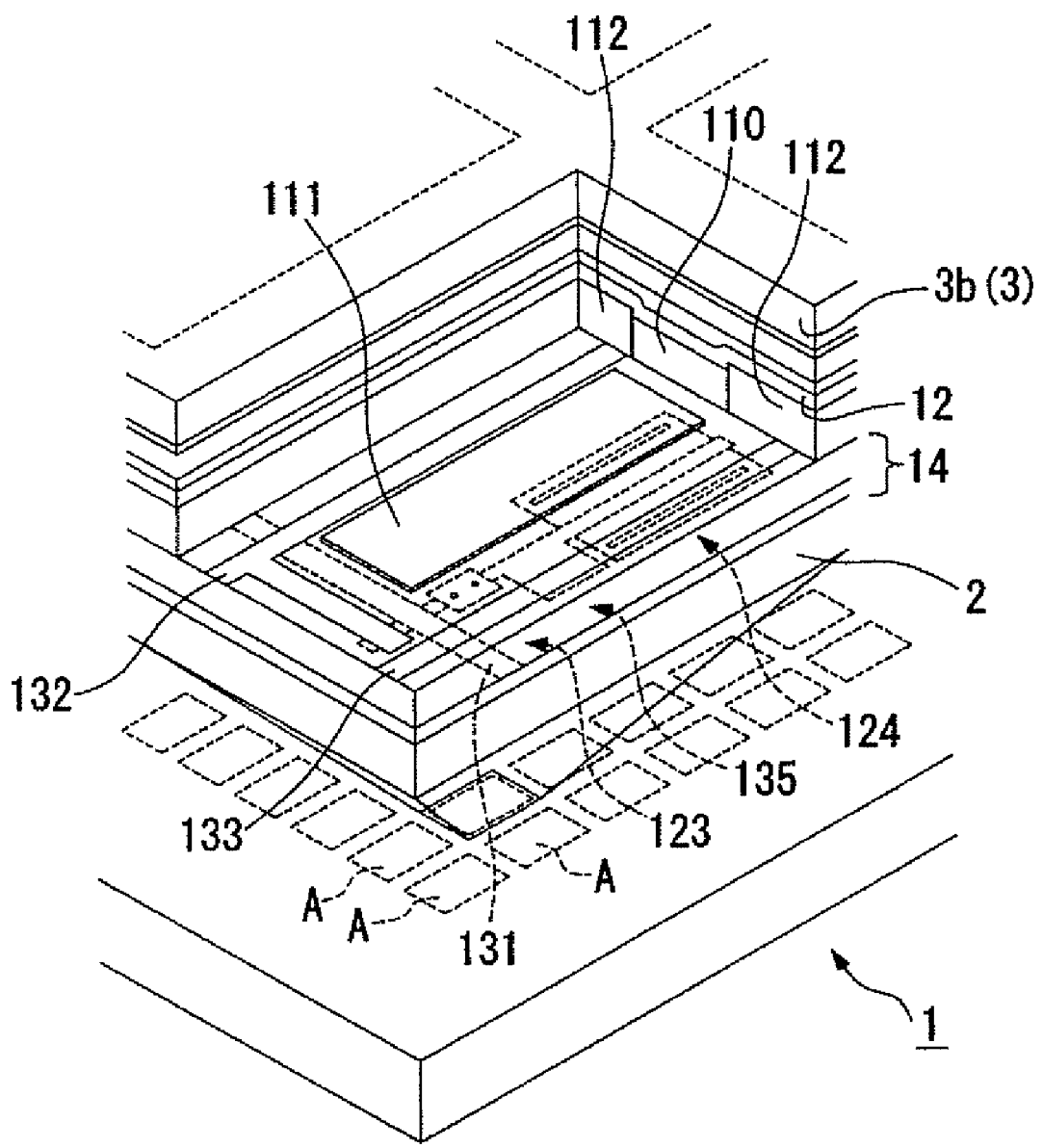
FIG. 1 is an explanatory diagram schematically illustrating the structure of an organic EL device according to a first embodiment of the invention.

Hereinafter, preferred embodiments of the invention will be described with reference to the accompanying drawings. In the drawings, each layer and each member are shown in different reduced scales so that they can be recognized.

First Embodiment

FIG. 1 is an explanatory diagram schematically illustrating the main parts of an organic electroluminescent (EL) device according to an embodiment of the invention, particularly, an active matrix organic EL device 1. In addition, the organic EL device 1 adopts an active matrix driving method using thin film transistors.

The organic EL device 1 is formed by laminating, on a substrate 2, a circuit element portion 14 including thin film transistors, serving as circuit elements, pixel electrodes (anodes) 111, a functional layer 110 including an organic EL layer (organic EL element), a cathode 12, a sealing portion 3, etc., in this order.

In this embodiment, a glass substrate is used as the substrate 2. However, various well-known substrates used for an electro-optical device or a circuit substrate, such as a silicon substrate, a quartz substrate, a ceramic substrate, a metal substrate, a plastic substrate, and a plastic film substrate, can be used as the substrate 2, in addition to the glass substrate. In addition, a plurality of pixel regions A, serving as light-emitting regions, are arranged in a matrix in the substrate 2. When color display is performed, the pixel regions A respectively corresponding to red (R), green (G), and blue (B) are provided in a predetermined arrangement. In each pixel region A, a pixel electrode 111 is provided, and a signal line 132, a power line 133, a scanning line 131, another scanning line (not shown) for the pixel electrode, etc., are arranged in the vicinity of the pixel electrode 111.

Further, the sealing portion 3 prevents the oxidation of the cathode 12 or the functional layer 110 caused by the permeation of water or oxygen, and includes a sealing resin coated on the substrate 2 and a sealing substrate 3b (sealing can) bonded to the substrate 2. The sealing resin is made of, for example, a thermosetting resin or an ultraviolet curable resin, preferably, an epoxy resin, which is a kind of thermosetting resin. The sealing resin is applied in a ring shape around the edge of the substrate 2 by, for example, a micro dispenser. The sealing substrate 3b is made of, for example, a metallic material or glass, and the substrate 2 and the sealing substrate 3b are bonded to each other with the sealing resin interposed therebetween.

Figure 2:
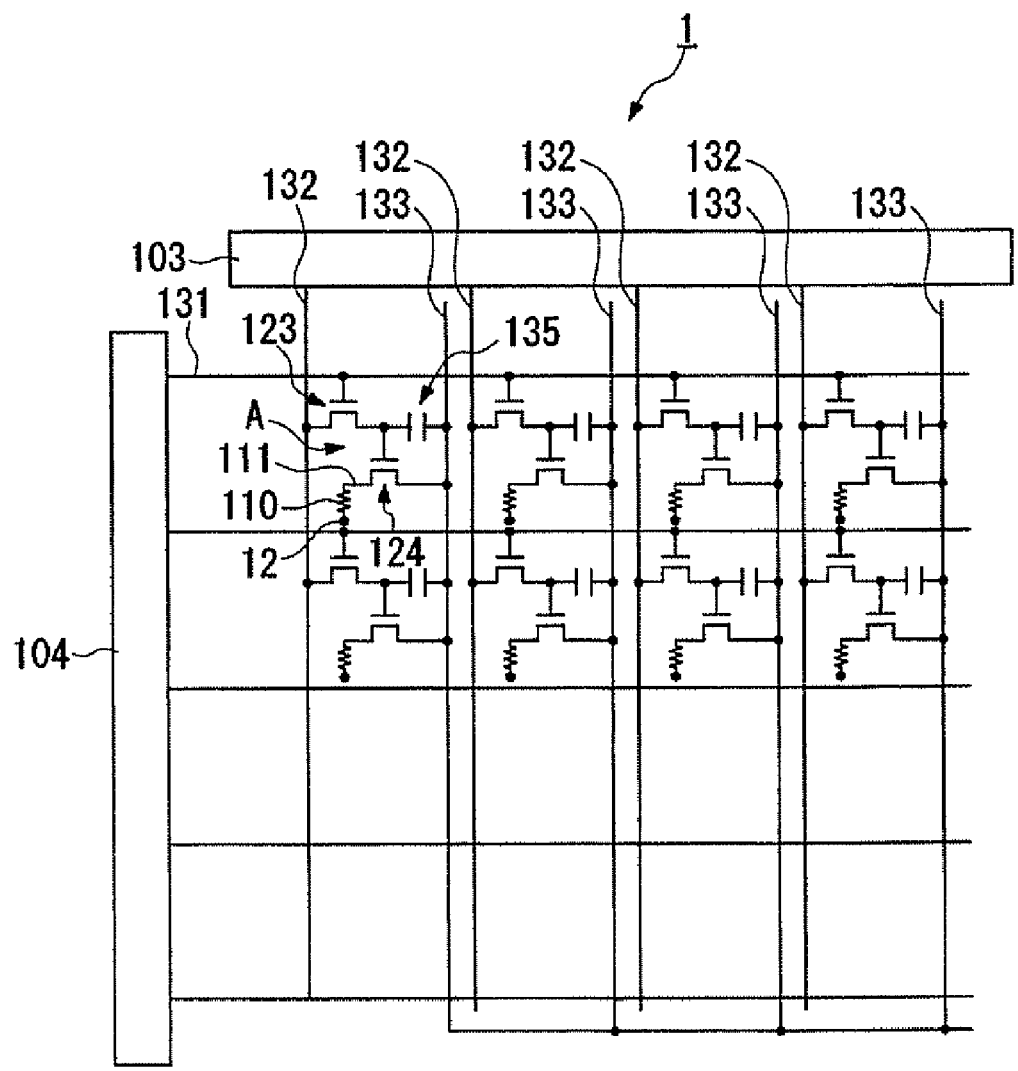
FIG. 2 is a circuit diagram illustrating the circuit structure of an active matrix organic EL device.

FIG. 2 shows the circuit structure of the organic EL device 1.

In FIG. 2, the substrate 2 has a plurality of scanning lines 131, a plurality of signal lines 132 extending in a direction perpendicular to the scanning lines 131, and a plurality of power lines 133 extending parallel to the signal lines 132 formed thereon. In addition, the pixel regions A are respectively formed at intersections of the scanning lines 131 and the signal lines 132.

The signal lines 132 are connected to a data line driving circuit 103 including, for example, a shift register, a level shifter, video lines, and analog switches. The scanning lines 131 are connected to a scanning line driving circuit 104 including a shift register and a level shifter.

Each pixel region A is provided with a first switching thin film transistor 123 whose gate electrode is supplied with scanning signals through the scanning line 131, a storage capacitor 135 for holding image signals supplied from the signal line 132 via the thin film transistor 123, a second driving thin film transistor 124 whose gate electrode is supplied with the image signals held in the storage capacitor 135, the pixel electrode 111 (anode) to which a driving current flows from the power line 133 when electrically connected to the power line 133 via the thin film transistor 124, and the functional layer 110 interposed between the pixel electrode 111 and a counter electrode 12 (cathode). The functional layer 110 includes an organic EL layer, serving as an organic EL element.

In the pixel region A, when the scanning line 131 is driven so that the first thin film transistor 123 is turned on, the potential of the scanning line 132 at that time is held in the storage capacitor 135, and the electrical connection state of the second thin film transistor 124 depends on the state of the storage capacitor 135. In addition, a current flows from the power line 133 to the pixel electrode 111 through a channel of the second thin film transistor 124, and then flows to the counter electrode 12 (cathode) via the functional layer 110. Then, the functional layer 110 emits light according to the amount of the flowing current.

Figure 3:
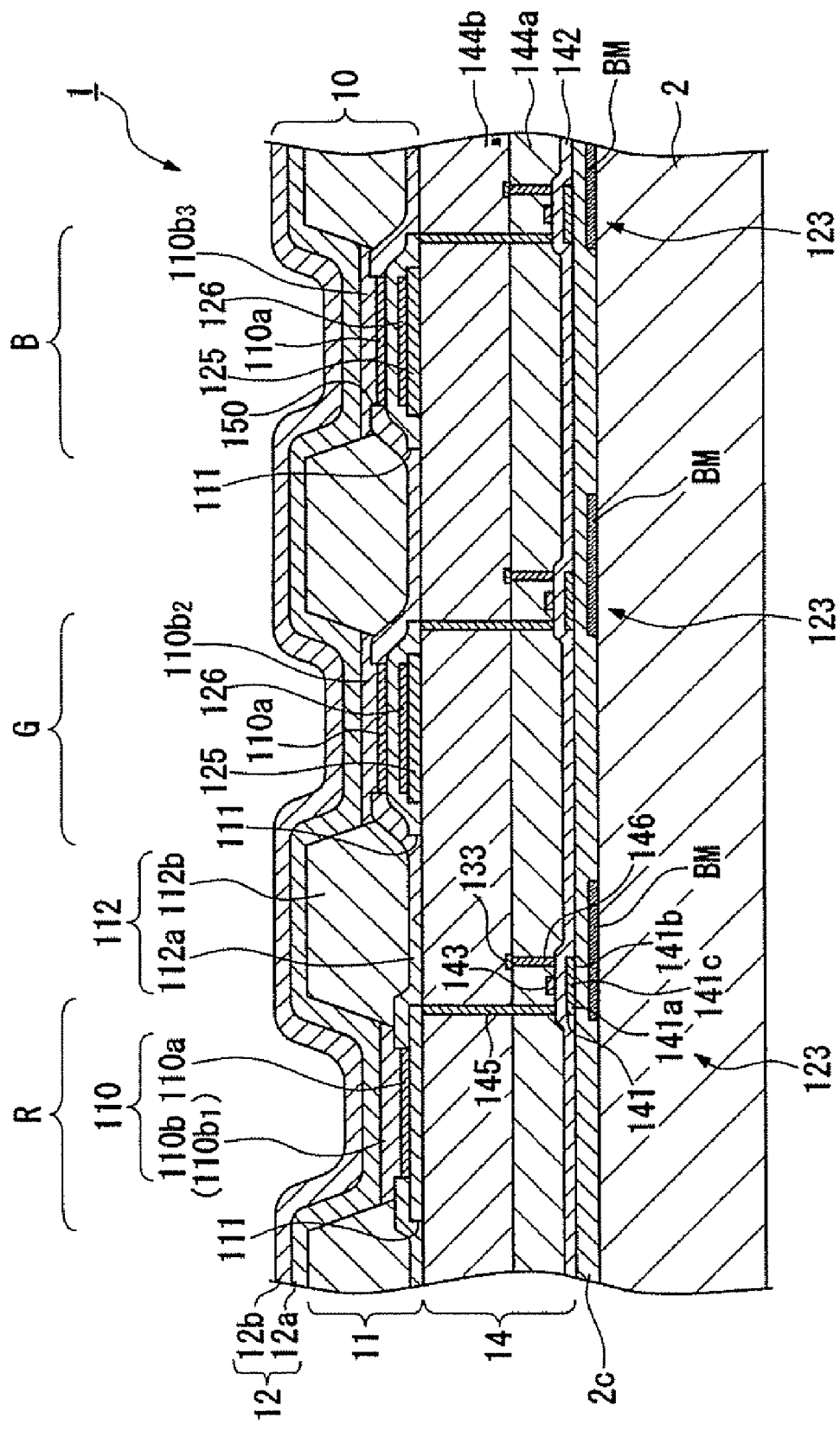
FIG. 3 is an enlarged view illustrating the sectional structure of a display region of the organic EL device according to the first embodiment.

FIG. 3 is an enlarged view illustrating the sectional structure of a display area of the organic EL device 1. FIG. 3 shows the sectional structure of three pixel regions corresponding to red (R), green (G), and blue (B). As described above, the organic EL device 1 is formed by laminating, on the substrate 2, the circuit element portion 14 having circuit elements, such as TFTs, thereon, the pixel electrode 111 (anode), the light-emitting element portion 11 provided with the functional layer 110, and the cathode 12 in flat order.

In this organic EL device 1, light emitted from the functional layer 110 towards the substrate 2 passes through the circuit element portion 14 and the substrate 2 and is then emitted from the lower side (observer side) of substrate 2. In addition, the light emitted from the functional layer 110 to the opposing side of the substrate 2 is reflected from the cathode 12 and is then emitted from the lower side (observer side) of substrate 2 through the circuit element portion 14 and the substrate 2.

In the circuit element portion 14, an island-shaped light-shielding layer BM made of a light-shielding material is formed on the substrate 2, and a base protecting layer 2c composed of a silicon oxide film is formed thereon. An island-shaped semiconductor film 141 made of polycrystalline silicon is formed on the base protecting layer 2c at a position overlapping the light-shielding layer BM in plan view. Furthermore, a source region 141a and a drain region 141b are formed in the semiconductor film 141 by implanting P ions therein at high concentration. Further, a region where the P ions are not implanted becomes a channel region 141c.

Moreover, a transparent gate insulating film 142 is formed on the circuit element portion 14 so as to cover the base protecting film 2c and the semiconductor film 141, and a gate electrode 143 (the scanning line) made of Al, Mo, Ta, Ti, W, or the like is formed on the gate insulating film 142. In addition, a first interlayer insulating film 144a and a second interlayer insulating film 144b, made of a transparent material, are formed on the gate electrode 143 and the gate insulating film 142. Transparent insulating films made of, for example, $SiO_2$ or SiN with a proper thickness (for example, a thickness of about 300 nm) can be used as the interlayer insulating films.

The gate electrode 143 is provided at a position corresponding to the channel region 141c of the semiconductor film 141. In addition, contact holes 145 and 146 are formed such that they pass through the first and second interlayer insulating films 144a and 144b and are then connected to source and drain regions 141a and 141b of the semiconductor film 141, respectively.

The transparent pixel electrode 111 made of, for example, ITO is formed in an island shape on the second interlayer insulating film 144b, and the contact hole 145 is connected to this pixel electrode 111. In addition, the contact hole 146 is connected to the power line 103. In this way, the driving thin film transistors 123 including the semiconductor film 141 that is connected to the pixel electrodes 11 are formed in the circuit element portion 14. Further, although not shown in FIG. 3, the storage capacitors 135 and the switching thin film transistors 124 are also formed in the circuit element portion 14.

As such, the pixel electrodes 111, the functional layer 110 etc., are formed on the second interlayer insulating film 144b. However, in this embodiment, the respective pixels corresponding to red (R), green (G), and blue (B) are different laminated structures. More specifically, in the green (G) and blue (B) pixels, a red absorption filter 125 and a transflective layer 126 are formed between the second interlayer insulating film 144b and the pixel electrode 111, and the functional layer 110 is formed on the red absorption filter 125 and the transflective layer 126. On the other side, the red absorption filter and the transflective layer are not provided in the red (R) pixel.

To be more particular, in the red (R) pixel, the pixel electrode 11 is patterned on the second interlayer insulating film 144b, and the light-emitting element portion 11 is formed thereon. The light-emitting element portion 11 includes, as the main components, the functional layer 110 formed on the pixel electrode 111 and a bank portion 112 provided between the functional layers 110 to partition the respective functional layers 110. The cathode 12 composed of a reflective metal film made of, for example, aluminum is provided on the functional layer 110.

Meanwhile, in the green (G) pixel, the red absorption filter 125 for absorbing red is provided on the second interlayer insulating film 144b so as to overlap a pixel aperture or to have a size slightly larger than pixel aperture in plan view. In addition, the transflective layer 126 for partially reflecting or transmitting light is formed on the red absorption filter 125 so as to overlap the pixel aperture or to have a size slightly larger than the pixel aperture in plan view. Further, the transflective layer 126 is composed of a thin reflective metal layer with a thickness of about 10 nm, which is made of, for example, aluminum.

The pixel electrode 111 is patterned to cover the red absorption filter 125 and the transflective layer 126, and the light-emitting element portion 11 is formed on the pixel electrode 111. The light-emitting element portion 11 includes, as the main components, the functional layer 110 formed on the pixel electrode 111 and the bank portion 112 provided between the functional layers 110 to partition the respective functional layers 110. The cathode 12 composed of a reflective metal film made of for example, aluminum is provided on the functional layer 110. In addition, the optical distance between the transflective layer 126 and the cathode 12 is designed so as to be equal to or longer than the wavelength of light (green light component) emitted from the corresponding pixel by an integral multiple. As a result, the transflective layer 126 and the cathode 12 constitute an optical resonator for light emitted from the corresponding pixel.

Further, in the blue (B) pixel, similar to the green (G) pixel, the red absorption filter 125 for absorbing red is provided on the second interlayer insulating film 144b so as to overlap a pixel aperture or to have a size slightly larger than pixel aperture in plan view. In addition, the transflective layer 126 for partially reflecting or transmitting light is formed on the red absorption filter 125 so as to overlap the pixel aperture or to have a size slightly larger than the pixel aperture in plan view. Further, the transflective layer 126 is composed of a thin reflective metal layer with a thickness of about 10 nm, which is made of, for example, aluminum.

Also, the pixel electrode 111 is patterned to cover the red absorption filter 125 and the transflective layer 126, and the light-emitting element portion 11 is formed on the pixel electrode 111. The light-emitting element portion 11 includes, as the main components, the functional layer 110 formed on the pixel electrode 111 and the bank portion 112 provided between the functional layers 110 to partition the respective functional layers 110. The cathode 12 composed of a reflective metal film made of for example, aluminum is provided on the functional layer 110. In addition, the optical distance between the transflective layer 126 and the cathode 12 is designed so as to be equal to or longer than the wavelength of light (blue light component) emitted from the corresponding pixel by an integral multiple. As a result, the transflective layer 126 and the cathode 12 constitute an optical resonator for light emitted from the corresponding pixel.

In the R, G, and B pixels, the pixel electrode 111 is patterned substantially in a rectangular shape in plan view. The pixel electrode 111 has preferably a thickness of 50 to 200 nm (for example, 70 nm), and more preferably, a thickness of about 150 nm. As shown in FIG. 3, the bank portion 112 is formed by laminating an inorganic bank layer (first bank layer) 112a located closer to the substrate 2 and an organic bank layer (second bank layer) 112b located apart from the substrate 2. The inorganic bank layer 112a is made of an inorganic material, such as $SiO_2$ or $TiO_2$. The organic bank layer 112b is made of a resist having heat resistance and solvent resistance, such as an acrylic resin or a polyamide resin.

The functional layer 110 is composed of a hole injection/transportation layer 110a laminated on the pixel electrode 111 and an organic EL layer (light-emitting layer) 110b provided adjacent to the hole injection/transportation layer 110a.

The hole injection/transportation layer 110a has a function of injecting holes into the organic EL layer 110b and a function of transporting the holes therein. The hole injection/transportation layer 110a is provided between the pixel electrode 111 and the organic EL layer 110b, which makes it possible to improve the luminous efficiency and lifespan of the organic EL layer 110b. In addition, in the organic EL layer 110b, the holes injected from the hole injection/transportation layer 110a are recombined with electrons injected from the cathode 12 to emit light.

Further, the hole injection/transportation layer 110a is formed by coating a mixture (PEDOT/PSS) of polythiophene derivative, such as polyethylenedioxythiophene (PEDOT) and polystyrene sulfonic acid (PSS) using an inkjet method. The hole injection/transportation layer 110a is formed with a thickness of 40 nm in the blue (B) pixel and a thickness of 70 nm in the red (R) and green (G) pixels. The hole injection/transportation layer 110a may be formed with different thicknesses in the respective pixels, but the thicknesses thereof can be equal to each other over all pixels by adjusting the thickness of the EL layer 110b formed thereon. In this way, the hole injection/transportation layer 110a can be easily manufactured. For example, it is possible to form the hole injection/transportation layer 110a with the same thickness of 50 nm. At that time, an organic EL layer 110b3 is formed with a thickness of 70 nm in the blue pixel, and an organic EL layer 110b2 is formed with a thickness of 90 nm in the green pixel, which makes it possible to simultaneously improve the chromaticity of the blue and green pixels.

For the organic EL layer 110b, a red organic EL layer 110b$_1$ made of a polymer material emitting red (R) light is formed in the red (R) pixel, and similarly, a green organic EL layer 110b$_2$ made of a polymer material emitting green (G) light is formed in the green (G) pixel. In addition, a blue organic EL layer 110b$_3$ made of a polymer material emitting blue (B) light is formed in the blue (B) pixel. The red, green, and blue pixels are arranged in a predetermined arrangement (for example, a stripe shape). The organic EL layers 110b$_1$, 110b$_2$, and 110b$_3$ are formed with the same thickness of about 80 nm over all pixels by coating light-emitting materials (polymer materials) using the inkjet method.

The red organic EL layer 110b$_1$ can be made of an organic EL material, such as rhodamine or a derivative thereof, and the green organic EL layer 110b$_2$ can be made of an organic EL material, such as quinacridone or a derivative thereof. In addition, the blue organic EL layer 110b$_3$ can be made of an organic EL material, such as distyrylbiphenyl or a derivative thereof, coumarin or a derivative thereof, or tetraphenylbutadiene or a derivative thereof.

Meanwhile, the bank layer 112 is obtained by forming an inorganic bank layer 112a having a thickness of about 50 nm with an inorganic material, such as $SiO_2$, so as to have a pixel aperture therein after the pixel electrode 111 is patterned, and by forming thereon an organic bank layer 112b having a thickness of about 2 μm with an organic material, such as polyimide, so as to have the same pixel aperture.

Then, the cathode (counter electrode) 12 is formed on the entire surface of the light-emitting element portion 11, and has a function of flowing a current to the functional layer 110 formed on the pixel electrode 111. In this embodiment, the cathode 112 has a laminated structure of a calcium layer 12a and an aluminum layer 12b. The aluminum layer 12b functions to reflect light emitted from the organic EL layer 110b toward the substrate 2, and may be composed of, for example, an Ag film or a laminated film of the Al film and the Ag film, in addition to the Al film. In addition, the aluminum layer 12 can have a thickness of, for example, 100 to 1000 nm.

The red absorption filter 125 can be selectively provided in the green (G) and blue (B) pixels by, for example, the inkjet method or photolithography method. More specifically, when the inkjet method is used, $CF_4$ plasma is applied on the entire surface of the second interlayer insulating film 144b, and ultraviolet rays are irradiated onto the green (G) and blue (B) pixels to change the surface properties thereof, thereby forming a uniform film.

In the organic EL device 1 having the above-mentioned structure, the transflective layer 126 and the cathode 12 constitute an optical resonator, and light emitted from the organic EL layer 110 toward the cathode 12 is reflected from the cathode 12, and then resonates between the cathode 12 and the transflective layer 126. When the reflected light has a wavelength capable of passing through the transflective layer 126 by the resonance, the reflected light passes through the transflective layer 126.

Meanwhile, a portion of the light emitted from the organic EL layer 110 toward the cathode 12 passes through the transflective layer 126, and the other thereof is reflected therefrom. As a result, the reflected light resonates between the cathode 12 and the transflective layer 126. When the reflected light has a wavelength capable of passing through the transflective layer 126 by the resonance, the reflected light passes through the transflective layer 126.

As described above, the light passing through the transflective layer 126 is emitted from the organic EL device 1 to contribute to display. However, in this embodiment, since the reflected light passes through the transflective layer 126 after resonance, the color purity of light emitted from the organic EL device 1 is improved. Therefore, when the organic EL device 1 of the invention is used as a display device, it is possible to display an image having high brightness and contrast. In this embodiment, chromaticity (x, y=0.14, 0.1) can be obtained in blue, and chromaticity (x, y=0.35, 0.61) can be obtained in green. In addition, chromaticity (x, y=0.66, 0.33) can be obtained in red. Further, a surface reflectance of 4% is obtained. In an organic EL device not including an optical resonance structure (that is, the transflective layer 126), the red absorption filter 125, and the light-shielding layer BM, chromaticity (x, y=0.15, 0.2) is obtained in blue, and chromaticity (x, y=0.42, 0.55) is obtained in green. In addition, a surface reflectance of 70% is obtained.

Furthermore, in this embodiment, the transflective layers 126 are selectively formed in the green (G) and blue (B) pixels. However, when the organic EL layer 110 is made of a polymer material, green and blue have relatively lower color purity than red.

In this embodiment, the transflective layers are formed in the green (G) and blue (B) pixels having relatively lower color impurity. Therefore, it is not necessary to form the organic EL layer with different thicknesses for each color in order to correct a difference in color purity.

That is, according to the structure of this embodiment, it is possible to reduce the thickness of the organic EL layer 110 for all pixels, and thus to prevent or suppress the generation of defects, such as an increase in driving voltage and the reduction of driving efficiency caused by a thick organic EL layer.

Further, a second filter for absorbing light having a wavelength smaller than 600 nm is provided on the light emission side of the red (R) pixel, which makes it possible to improve contrast and to lower the surface reflectance up to 3%. The second filter can be formed in the red (R) pixel by the inkjet method when the red absorption filters are formed in the green (G) and blue (B) pixels by the inkjet method. In addition, the same effect as described above can be obtained by applying a material for absorbing light having a wavelength smaller than 600 nm, specifically, a red dye or red pigment, on the transparent pixel electrode 111, without additionally providing the second filter.

Hereinafter, a method of manufacturing the organic EL device 1 of the first embodiment will be described.

First, after the light-shielding layer BM is formed on the substrate 2 by the well-known photolithography technique, the base protecting film 2c and the TFT 123 are formed, and the interlayer insulating films 144a and 144b are formed, thereby forming a base substrate of an EL device. Then, a resin layer for absorbing red light is formed on the second interlayer insulating film 144b, and is also selectively formed on the green (G) and blue (B) pixels by the photolithography technique, thereby forming the red absorption filter 125. In the filter forming process, the inkjet method or the photolithography method can be used. When the inkjet method is used, $CF_4$ plasma is applied on the entire surface of the second interlayer insulating film 144b, and ultraviolet rays are irradiated onto the green (G) and blue (B) pixels to change the surface properties thereof, thereby forming a more uniform film.

Next, aluminum is selectively formed with a thickness of about 10 nm on the green (G) and blue (B) pixels on the red absorption filter to form the transflective layer 126. Subsequently, ITO, serving as a transparent anode with respect to all pixels, is formed in a pattern with a thickness of about 70 nm, and $SiO_2$ is formed in a pattern with a thickness of about 50 nm to form the inorganic bank layer 112a, serving as a pixel aperture film. In addition, polyimide is formed in a pattern with a thickness of about 2 µm to form the organic bank layer 112b. Then, a liquid composite containing a PEDOT/PSS material is applied in regions surrounded by the formed bank portions by the inkjet method to form the hole injecting/transporting layer, such that it is formed with a thickness of about 40 nm in the blue (B) pixel and with a thickness of about 70 nm in the red (R) and green (G) pixels. In addition, a polymer light-emitting material is formed in the R, G, and B pixels in a pattern by the inkjet method. The thickness of the light-emitting layer formed at that time is about 80 nm. Successively, the cathode 12 is formed, and then a sealing process is performed, thereby obtaining the organic EL device 1 of the first embodiment.

Second Embodiment

Figure 4:
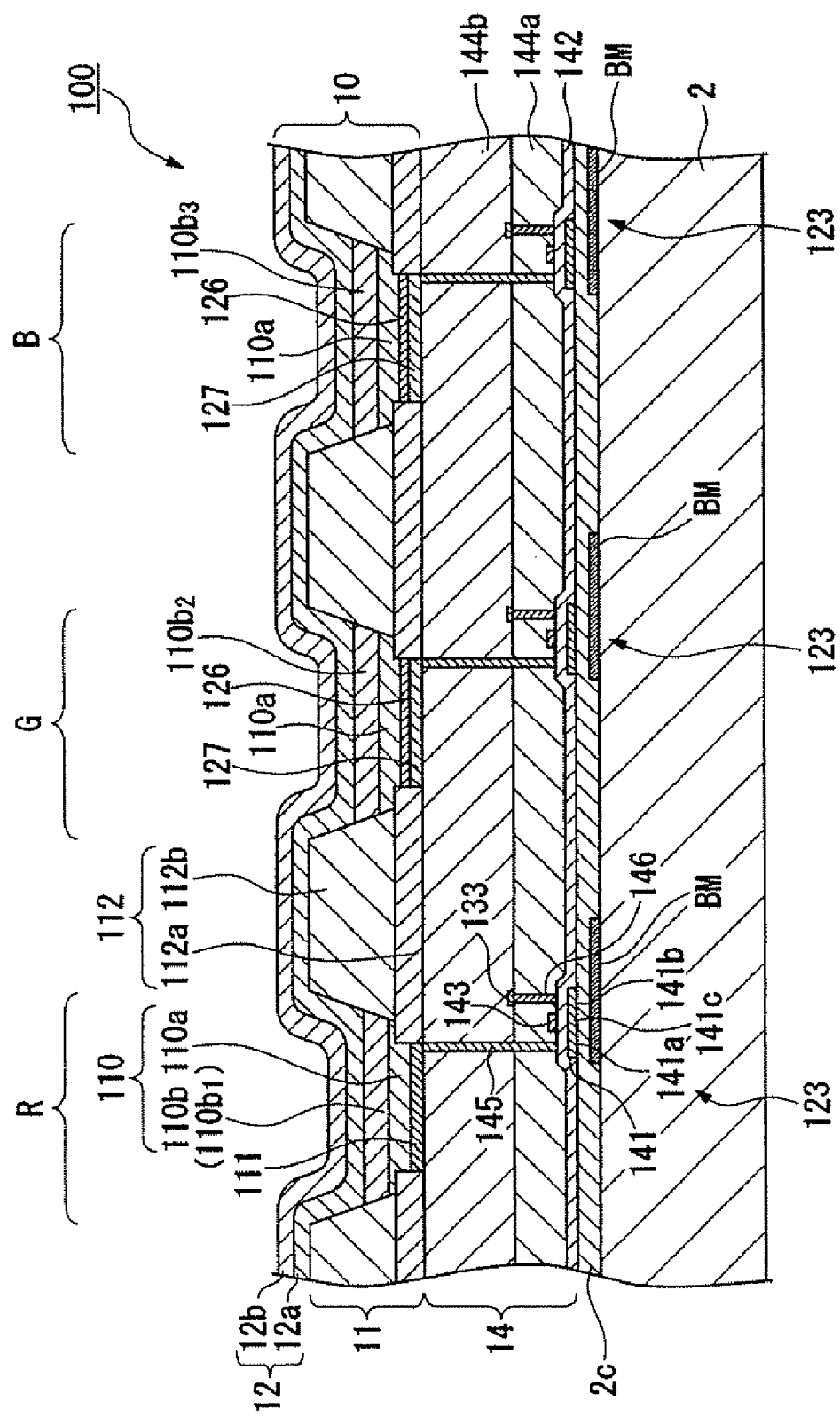
FIG. 4 is an enlarged view illustrating the sectional structure of a display region of an organic EL device according to a second embodiment.

Next, an organic EL device according to a second embodiment will be described with reference to FIG. 4. This embodiment is characterized in that the pixel electrodes 111 having a function of absorbing red light are provided in the green (G) and blue (B) pixels, unlike the first embodiment, and the other structures thereof are substantially the same as those in the first embodiment. Therefore, in this embodiment, components different from those in the first embodiment will be described in detail.

An organic EL device 100 of the second embodiment has the same structure as the organic EL device 1 of the first embodiment in the red (R) pixel. On the other hand, for the green (G) and blue (B) pixels, pixel electrodes 127 having both an electrode (anode) function and a filter function of absorbing light (corresponding to red light) having a wavelength greater than 550 nm are provided on the second interlayer insulating film 144b. More specifically, an Sn phthalocyanine composite is dispersed in a transparent metallic material having conductivity, such as ITO. This structure makes it possible to reduce the thickness of an organic EL device and to simplify the manufacturing process thereof.

According to a method of manufacturing the organic EL device 100, first, similar to the first embodiment, after the light-shielding layer BM is formed on the substrate 2, the base protecting film 2c and the TFT 123 are formed, and the interlayer insulating films 144a and 144b are formed, thereby forming a base substrate of the EL device. Then, an inorganic material, such as $SiO_2$, is applied on the entire surface of the second interlayer insulating film 144b, and then the inorganic bank layer 112a having the pixel aperture is formed by the well-known photolithography technique. In addition, the organic bank layer 112b having the same pixel aperture is formed on the inorganic bank layer 112a.

Then, a liquid composite obtained by dispersing an Sn phthalocyanine compound and ITO in a solvent is applied on the green (G) and blue (B) pixels surrounded by the bank portions using a dispenser, and a liquid composite obtained by dispersing ITO in a solvent is applied on the red (R) pixel surrounded by the bank portions. Subsequently, after the formed film is baked, a silver paint solution is applied on the green (G) and blue (B) pixels by the inkjet method or dispensing method, thereby forming a transflective layer having a transmittance of 50% in the green (G) and blue (B) pixels. Then, similar to the first embodiment, the hole injecting transporting layer, the organic EL layer, the cathode, etc., are formed, and a sealing process is performed, thereby forming the organic EL device 100 of the second embodiment.

Third Embodiment

Next, an organic EL device according to a third embodiment will be described with reference to FIG. 5. In the third embodiment, in the green (G) and blue (B) pixels, two pixel electrodes are formed in one pixel, and two TFTs are formed corresponding thereto, unlike the first and second embodiments. On the other hand, the red (R) pixel has the same structure as those in the first and second embodiments. Therefore, components different from those in the first and second embodiments will be described below in detail.

Figure 5:
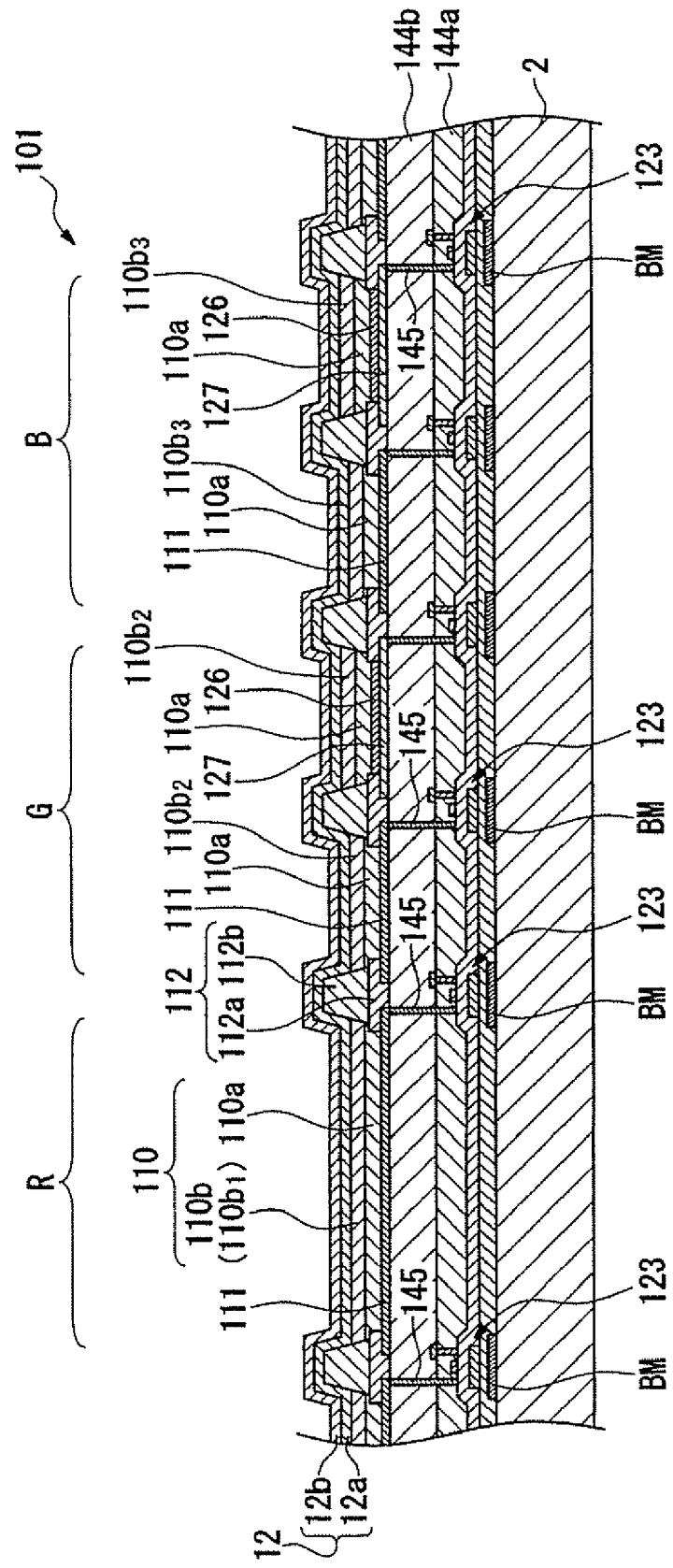
FIG. 5 is an enlarged view illustrating the sectional structure of a display region of an organic EL device according to a third embodiment.

In an organic EL device 101 shown in FIG. 5, each of the green (G) and blue (B) pixels is divided into two dots, and two pixel electrodes are formed in one pixel. The two pixel electrodes formed in one pixel are a pixel electrode 127 (hereinafter, referred to as a colored pixel electrode 127), functioning as a red absorption filter, and the pixel electrode 111 not having the filter function, respectively, and the TFTs 123 are respectively connected to the pixel electrodes 127 and 111. The dot having the colored pixel electrode 127 and the dot having the pixel electrode 111 are separated from each other by the bank portion 112. In the dot having the colored pixel electrode 127, the same transflective layer 126 as in the second embodiment is formed on the colored pixel electrode 127, and the hole injecting/transporting layer 110a and the light-emitting layer 110b are formed thereon. In addition, the transflective layer is not formed on the pixel electrode, and the hole injecting/transporting layer 110a and the light-emitting layer 110b are formed in the green (G) and blue (B) pixels, similar to the red (R) pixel.

Figure 6:
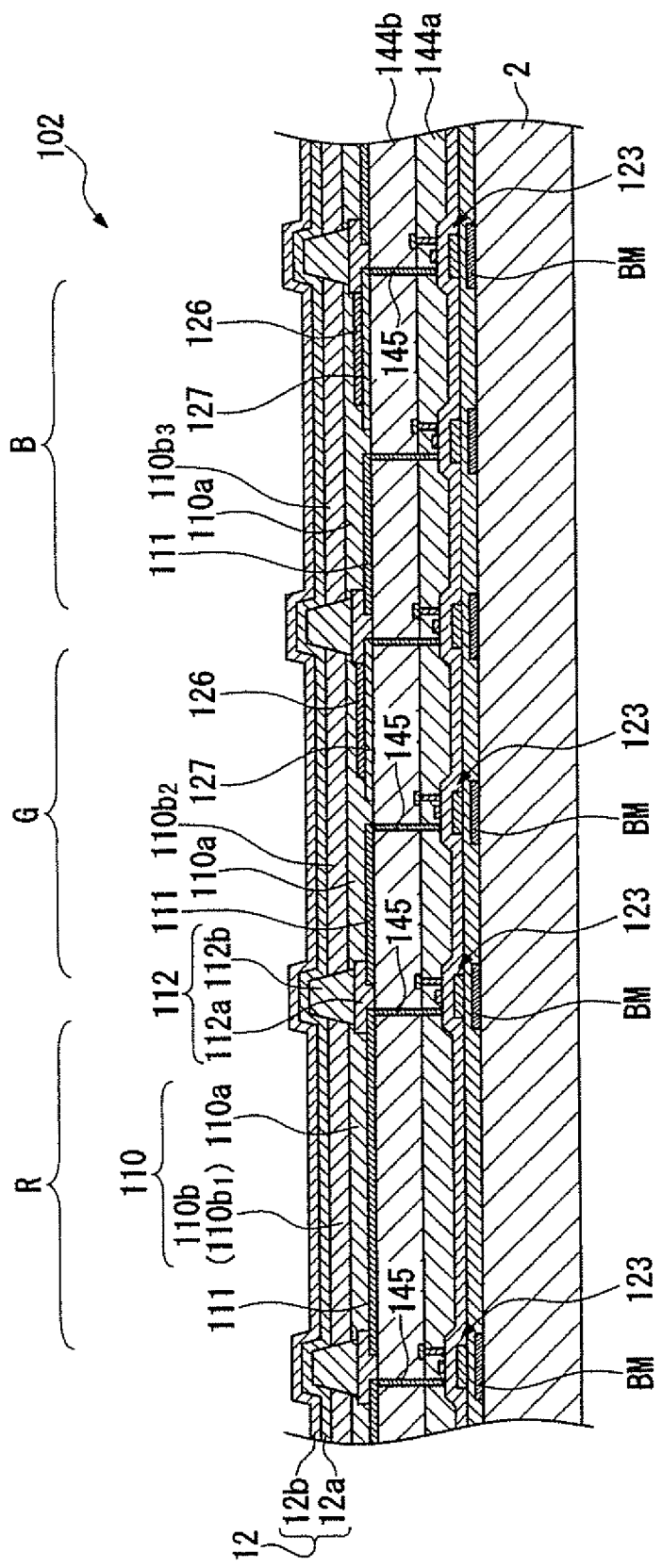
FIG. 6 is an enlarged view illustrating the sectional structure of a display region of an organic EL device according to a modification of the third embodiment.

In the third embodiment, the cathode 12 is the same structure as those in the first and second embodiments, and thus this embodiment can exhibit the same effects as those in the first and second embodiment. In addition, the third embodiment makes it possible to improve the brightness of a display, compared to the structure in which the transflective layer 126 is formed on all the green (G) and blue (B) pixels. The structure in which one pixel is divided into a plurality of dots as in the third embodiment can also be applied to an organic EL device having the red absorption filters 125 therein as in the first embodiment. In addition, when a pixel is divided into a plurality of dots, the dots are not necessarily divided by the bank layer, but the respective dots may be formed without the bank layer as in the organic EL device 102 shown in FIG. 6. Further, for example, in order to obtain vivid colors, it is preferable to drive only the dot having the transflective layer 126 therein in each of the green (G) and blue (B) pixels. On the other hand, in order to display a light color and a natural tint, it is possible to drive both the dot having the transflective layer 126 and the dot not having the transflective layer 126 in each of the green (G) and blue (B) pixels.

Fourth Embodiment

Figure 7:
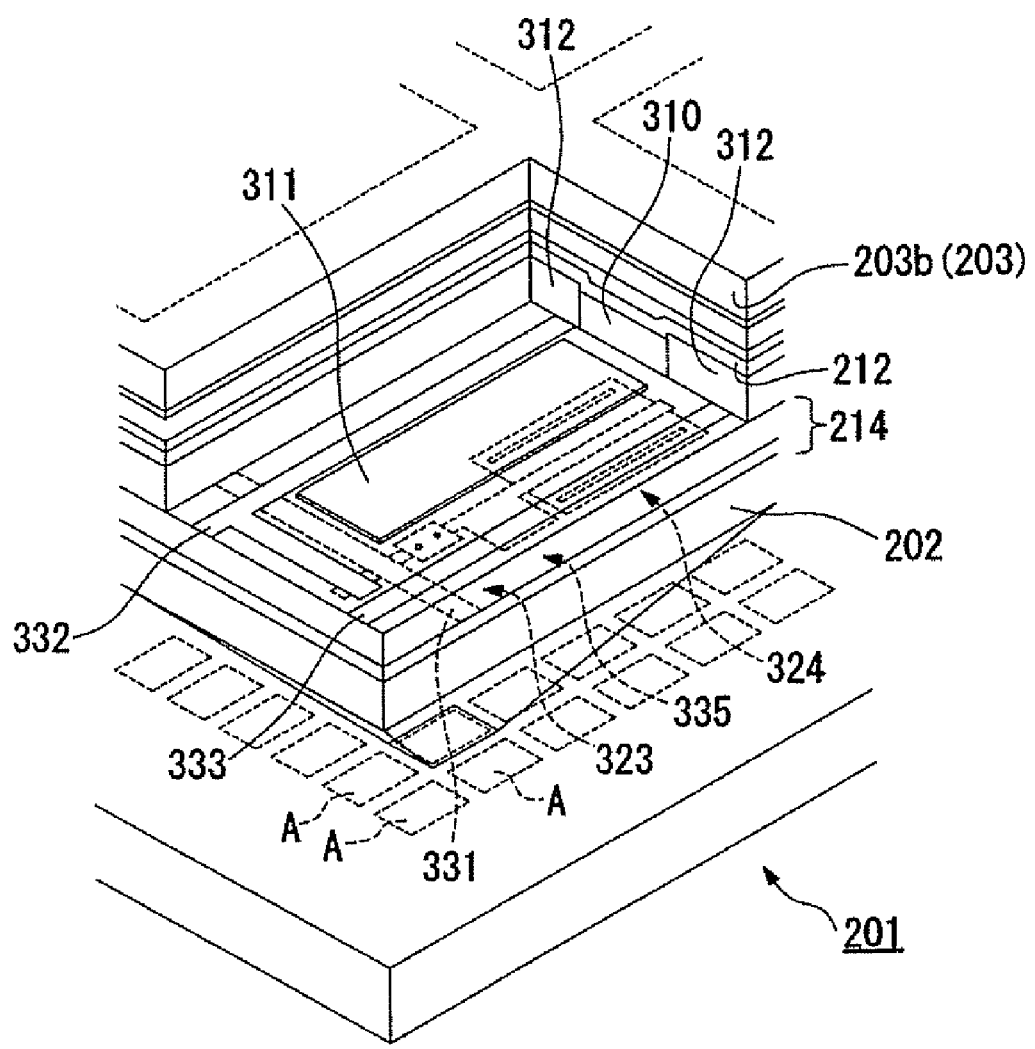
FIG. 7 is an explanatory diagram schematically illustrating the structure of an organic EL device according to a fourth embodiment.

FIG. 7 is a diagram schematically illustrating the main parts of an organic EL device according to this embodiment, particularly, an active matrix organic EL device 201. In addition, the organic EL device 201 adopts an active driving method using thin film transistors.

Similar to the first embodiment, the organic EL device 201 is formed by laminating, on a substrate 202, a circuit element portion 214 including thin film transistors, serving as circuit elements, pixel electrodes (anodes) 311, a functional layer 310 including an organic EL layer (organic EL element) 310b, a cathode 212, a sealing portion 203, etc., in this order.

Similar to the first embodiment, in the present embodiment, a glass substrate is used as the substrate 202. However, various well-known substrates used for an electro-optical device or a circuit substrate, such as a silicon substrate, a quartz substrate, a ceramic substrate, a metal substrate, a plastic substrate, and a plastic film substrate, can be used as the substrate 202, in addition to the glass substrate. In addition, a plurality of pixel regions A, serving as light-emitting regions, are arranged in a matrix in the substrate 202, similar to the first embodiment. When color display is performed, the pixel regions A respectively corresponding to red (R), green (G), and blue (B) are provided in a predetermined arrangement. In each pixel region A, a pixel electrode 311 is provided, and a signal line 332, a power line 333, a scanning line 331, another scanning line (not shown) for the pixel electrode, etc., are arranged in the vicinity of the pixel electrode 311.

Further, similar to the first embodiment, the sealing portion 203 prevents the oxidation of the cathode 212 or the functional layer 310 caused by the permeation of water or oxygen, and includes a sealing resin coated on the substrate 202 and a sealing substrate 203b (sealing can) bonded to the substrate 202. The sealing resin is made of, for example, a thermosetting resin or an ultraviolet curable resin, preferably, an epoxy resin, which is a kind of thermosetting resin. The sealing resin is applied in a ring shape around the edge of the substrate 202 by, for example, a micro dispenser. The sealing substrate 203b is made of, for example, a metallic material or glass, and the substrate 202 and the sealing substrate 203b are bonded to each other with the sealing resin interposed therebetween.

Figure 8:
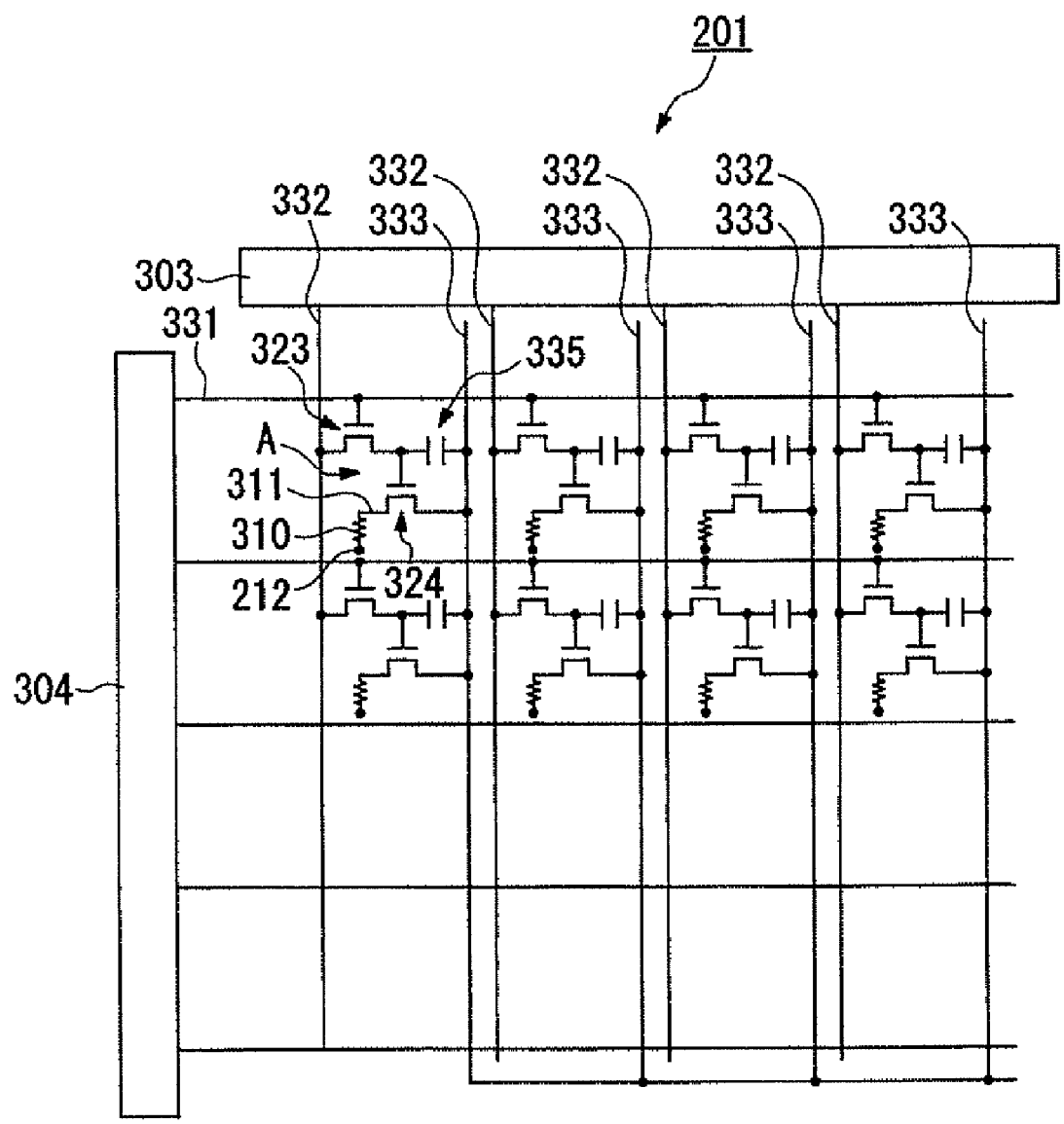
FIG. 8 is a circuit diagram illustrating the circuit structure of an active matrix organic EL device.

FIG. 8 shows the circuit structure of the organic EL device 201.

In FIG. 8, similar to the first embodiment, the substrate 202 has a plurality of scanning lines 331, a plurality of signal lines 332 extending in a direction perpendicular to the scanning lines 331, a plurality of power lines 333 extending parallel to the signal lines 332 formed thereon. In addition, the pixel regions A are respectively formed at intersections of the scanning lines 331 and the signal lines 332.

The signal lines 332 are connected to a data line driving circuit 303 including, for example, a shift register, a level shifter, video lines, and analog switches. The scanning lines 331 are connected to a scanning line driving circuit 304 including a shift register and a level shifter.

Similar to the first embodiment, each pixel region A is provided with a first switching thin film transistor 323 whose gate electrode is supplied with scanning signals through the scanning line 331, a storage capacitor 335 for holding image signals supplied from the signal line 332 via the thin film transistor 323, a second driving thin film transistor 324 whose gate electrode is supplied with the image signals held in the storage capacitor 335, the pixel electrode 311 (anode) to which a driving current flows from the power line 333 when electrically connected to the power line 333 via the thin film transistor 324, and the functional layer 310 interposed between the pixel electrode 311 and a counter electrode 212 (cathode). The functional layer 310 includes an organic EL layer, serving as an organic EL element.

Similar to the first embodiment, in the pixel region A, when the scanning line 331 is driven so that the first thin film transistor 323 is turned on, the potential of the scanning line 332 at that time is held in the storage capacitor 335, and the electrical connection state of the second thin film transistor 324 depends on the state of the storage capacitor 335. In addition, a current flows from the power line 333 to the pixel electrode 311 through a channel of the second thin film transistor 324, and then flows to the counter electrode 212 (cathode) via the functional layer 310. Then, the functional layer 310 emits light according to the amount of the flowing current at that time.

Figure 9:
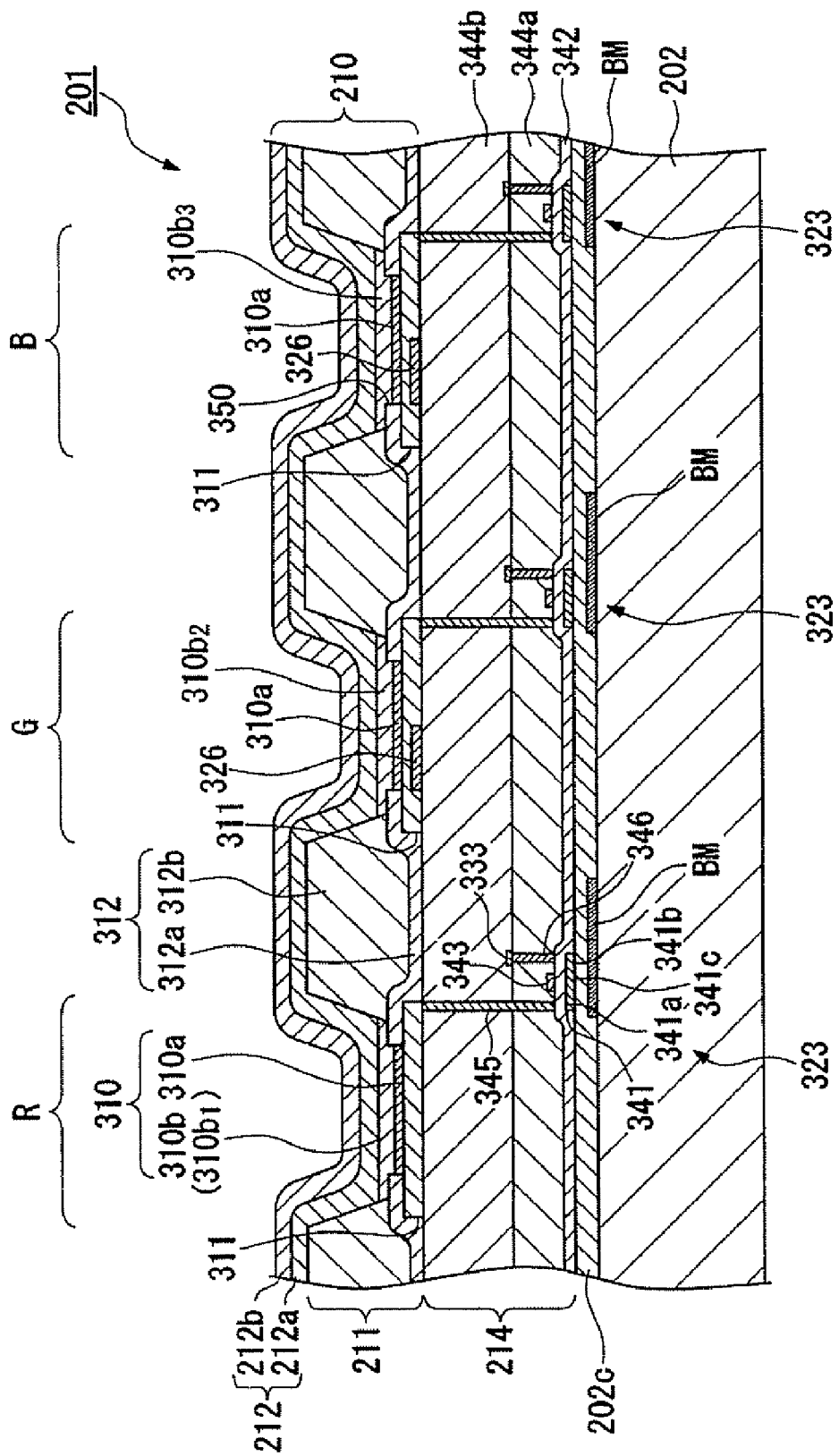
FIG. 9 is an enlarged view illustrating the sectional structure of a display region of an organic EL device according to a fourth embodiment.

FIG. 9 is an enlarged view illustrating the sectional structure of a display area of the organic EL device 201. FIG. 9 shows the sectional structure of three pixel regions corresponding to red (R), green (G), and blue (B). As described above, the organic EL device 201 is formed by laminating, on the substrate 2, the circuit element portion 214 having circuit elements, such as TFTs, thereon, the pixel electrode 311

(anode), the light-emitting element portion 211 provided with the functional layer 310, and the cathode 212 in this order.

In this organic EL device 201, light emitted from the functional layer 310 towards the substrate 202 passes through the circuit element portion 214 and the substrate 202 and is then emitted from the lower side (observer side) of substrate 202. In addition, the light emitted from the functional layer 310 to the opposing side of the substrate 202 is reflected from the cathode 212 and is then emitted from the lower side (observer side) of substrate 202 through the circuit element portion 214 and the substrate 202.

Similar to the first embodiment, in the circuit element portion 214, an island-shaped light-shielding layer BM made of a light-shielding material is formed on the substrate 202, and a base protecting layer 202c composed of a silicon oxide film is formed thereon. An island-shaped semiconductor film 341 made of polycrystalline silicon is formed at a position overlapping the light-shielding layer BM in plan view on the base protecting layer 202c. Furthermore, a source region 341a and a drain region 341b are formed in the semiconductor film 341 by implanting P ions therein at high concentration. Further, a region where the P ions are not implanted becomes a channel region 341c.

Moreover, similar to the first embodiment, a transparent gate insulating film 342 is formed in the circuit element portion 214 so as to cover the base protecting film 202c and the semiconductor film 341, and a gate electrode 343 (the scanning line) made of Al, Mo, Ta, Ti, W, or the like is formed on the gate insulating film 342. In addition, a first interlayer insulating film 344a and a second interlayer insulating film 344b, made of a transparent material, are formed on the gate electrode 343 and the gate insulating film 342. Transparent insulating films made of, for example, $SiO_2$ or SiN with a proper thickness (for example, a thickness of about 200 nm) can be used as the interlayer insulating films.

Further, similar to the first embodiment, the gate electrode 343 is provided at a position corresponding to the channel region 341c of the semiconductor film 341. In addition, contact holes 345 and 346 are formed such that they pass through the first and second interlayer insulating films 344a and 344b and are then connected to source and drain regions 341a and 341b of the semiconductor film 341, respectively.

Unlike the first embodiment, the transflective layer 326 made of a reflective material, such as Al, is formed in an island-shaped pattern, and the transparent pixel electrode 311 made of, for example, ITO is formed in an island shape on the second interlayer insulating film 344b.

The pixel electrode 311 is connected to the TFT 323 through the contact hole 345. The contact hole 346 is connected to the power line 333. In this way, although not shown in FIG. 9, the storage capacitors 335 and the switching thin film transistors 324 are also formed in the circuit element portion 214.

As such, the pixel electrodes 311 and the transflective layer 326 are formed on the second interlayer insulating film 344b. The transflective layers 326 in the red (R), green (G), and blue (B) pixels are different reflectances. More specifically, the transflective layers 326 in the respective pixels are formed so as to satisfy the following reflectance relationship: the reflectance of the red pixel<the reflectance of the green pixel<the reflectance of the blue pixel. In this embodiment, in order to make reflectances different from each other, the ratio of occupation areas of the transflective layer 326 in the respective pixels is set to establish the following relationship: (the occupation area of the red pixel):(the occupation area of the green pixel):(the occupation area of the blue pixel)=0:50:50. Therefore, in this embodiment, the reflectance ratio of the transflective layers 326 in the respective pixels are set to establish the following relationship: (the reflectance of the transflective layer of the red pixel):(the reflectance of the transflective layer of the green pixel):(the reflectance of the transflective layer of the blue pixel)=0:50:50.

The transflective layer 326 has a function of partially reflecting and transmitting light emitted from the organic EL layer (light-emitting layer) 310b of the functional layer 310 and is formed so as to overlap the pixel aperture or to have a size slightly larger than the pixel aperture in plan view. Further, the transflective layer 326 is composed of a thin reflective metal layer with a thickness of about 10 nm, which is made of, for example, aluminum.

The pixel electrode 311 is patterned substantially in a rectangular shape in plan view. The pixel electrode 311 has preferably a thickness of 50 to 200 nm (for example, 70 nm).

The light-emitting element portion 211 is formed on the transflective layer 326 and the pixel electrode 311. The light-emitting element portion 211 includes, as the main components, the functional layer 310 formed on the pixel electrode 311 and a bank portion 312 provided between the functional layers 310 to partition the respective functional layers 310. The cathode 212 composed of a reflective metal film made of, for example, aluminum is provided on the functional layer 310. In addition, the optical distance between the transflective layer 326 and the cathode 212 is designed so as to be equal to or longer than the wavelength of light emitted from the corresponding pixel by an integral multiple. As a result, the transflective layer 326 and the cathode 212 constitute an optical resonator for light emitted from the corresponding pixel.

Similar to the first embodiment, as shown in FIG. 9, the bank portion 312 is formed by laminating an inorganic bank layer (first bank layer) 312a located closer to the substrate 202 and an organic bank layer (second bank layer) 312b located apart from the substrate 202. The inorganic bank layer 312a is made of an inorganic material, such as $SiO_2$ or $TiO_2$. The organic bank layer 312b is made of a resist having heat resistance and solvent resistance, such as an acrylic resin or polyimide resin.

Further, similar to the first embodiment the functional layer 310 is composed of a hole injection/transportation layer 310a laminated on the pixel electrode 311 and an organic EL layer (light-emitting layer) 310b provided adjacent to the hole injection/transportation layer 310a.

The hole injection/transportation layer 310a has a function of injecting holes into the organic EL layer 310b and a function of transporting the holes therein. The hole injection/transportation layer 310a is provided between the pixel electrode 311 and the organic EL layer 310b, which makes it possible to improve the luminous efficiency and life span of the organic EL layer 110b. In addition, in the organic EL layer 310b, the holes injected from the hole injection/transportation layer 310a are recombined with electrons injected from the cathode 212 to emit light.

Further, the hole injection/transportation layer 310a is formed by coating a mixture (PEDOT/PSS) of polythiophene derivative, such as polyethylenedioxythiophene (PEDOT), and polystyrene sulfonic acid (PSS) using the inkjet method. Therefore, unlike the first embodiment, the hole injection/transportation layer 310a is formed with the same thickness of 50 nm in the respective pixels.

Similar to the first embodiment, For the organic EL layer 310b, a red organic EL layer $310b_1$ made of a polymer material emitting red (R) light is formed in the red (R) pixel, and similarly, a green organic EL layer $310b_2$ made of a polymer material emitting green (G) light is formed in the green (G)

pixel. In addition, a blue organic EL layer 310$b_3$ made of a polymer material emitting blue (B) light is formed in the blue (B) pixel. The red, green, and blue pixels are arranged in a predetermined arrangement (for example, a stripe shape). The organic EL layers 310$b_1$, 310$b_2$, and 310$b_3$ are formed by respectively coating light-emitting materials (polymer materials) using the inkjet method. Unlike the first embodiment, the organic EL layers 310$b_1$, 310$b_2$, and 310$b_3$ have a thickness of 80 nm in the red and green pixels and a thickness of 70 nm in the blue pixel, respectively.

The red organic EL layer 310$b_1$ can be made of a polyfluorene-based organic EL material or PPV or MEH-PPV containing a rhodamine pigment, and the green organic EL layer 310$b_2$ can be made of an organic EL material, such as a PPV derivative or a fluorene derivative, such as F8BT+polydioctylfluorene. In addition, the blue organic EL layer 310$b_3$ can be made of an organic EL material, such as a polydioctylfluorene derivative.

Meanwhile, similar to the first embodiment, the bank layer 312 is obtained by forming an inorganic bank layer 312$a$ having a thickness of about 50 mm with an inorganic material, such as $SiO_2$, so as to have a pixel aperture therein after the pixel electrode 311 is patterned, and by forming thereon an organic bank layer 312$b$ having a thickness of about 2 μm with an organic material, such as polyimide, so as to have the same pixel aperture.

Then, similar to the first embodiment, the cathode (counter electrode) 212 is formed on the entire surface of the light-emitting element portion 211, and has a function of flowing a current to the functional layer 310 formed on the pixel electrode 311. In this embodiment, the cathode 212 has a laminated structure of a calcium layer 212$a$ and an aluminum layer 212$b$. The aluminum layer 212$b$ functions to reflect light emitted from the organic EL layer 310$b$ toward the substrate 202, and may be composed of, for example, an Ag film or a laminated film of the Al film and the Ag film, in addition to the Al film. In addition, the aluminum layer 212 can have a thickness of, for example, 100 nm to 1000 nm.

In the organic EL device 201 having the above-mentioned structure, similar to the first embodiment, the transflective layer 326 and the cathode 212 constitute an optical resonator, and light emitted from the organic EL layer 310 toward the cathode 212 is reflected from the cathode 212, and then resonates between the cathode 212 and the transflective layer 326. When the reflected light has a wavelength capable of passing through the transflective layer 326 by the resonance, the reflected light passes through the transflective layer 326.

Meanwhile, a portion of the light emitted from the organic EL layer 310 toward the cathode 212 passes through the transflective layer 326, and the other thereof is reflected therefrom. As a result, the reflected light resonates between the cathode 212 and the transflective layer 326. When the reflected light has a wavelength capable of passing through the transflective layer 326 by the resonance, the reflected light passes through the transflective layer 326.

As described above, similar to the first embodiment, the light passing through the transflective layer 326 is emitted from the organic EL device 201 to contribute to display. However, in this embodiment, since the reflected light passes through the transflective layer 326 after resonance, the color purity of light emitted from the organic EL device 201 is improved. Therefore, when the organic EL device 201 of the invention is used as a display device, it is possible to display an image having high brightness and contrast. In this embodiment, similar to the first embodiment, chromaticity (x, y=0.14, 0.16) can be obtained in blue, and chromaticity (x, y=0.40, 0.59) can be obtained in green. In addition, chromaticity (x, y 0.66, 0.33) can be obtained in red. Further, in an organic EL device not including an optical resonance structure (that is, the transflective layer 126), chromaticity (x, y=0.15, 0.2) is obtained in blue, and chromaticity (x, y=0.42, 0.55) is obtained in green.

Furthermore, in this embodiment, the transflective layer 326 is selectively formed in the green (G) and blue (B) pixels. However, when the organic EL layer 110 is made of a polymer material, green and blue have relatively lower color purity than red.

In this embodiment, the organic EL layer 310 is made of a polymer material. The color purities of blue and green are relatively lower than that of red, and particularly, the color purity of blue is relatively lower than that of red. Therefore, in this embodiment, the transflective layers 326 in the green (G) and blue (B) pixels having relatively lower color purity have high reflectance, and the transflective layer 326 in the red (R) pixel having relatively higher color purity has low reflectance (occupation area). Therefore, it is possible to obtain uniform color purity for all the red, green, and blue pixels.

Furthermore, when the optical resonance structure is used, in general, color purity is improved, but luminous efficiency is lowered. Therefore, in this embodiment, the transflective layers 326 are constructed such that reflectances thereof are different from each other for the respective color pixels. Thus, it is possible to prevent the reduction of luminous efficiency caused by the introduction of the transflective layer 326 to the minimum. More specifically, in the organic EL device 201 of this embodiment, when all pixels are driven to perform white display, it is possible to obtain a brightness of 250 Cd/m$^2$ and the amount of light of 31 m/W at the time of light emission. On the other hand, in an organic EL device not having the optical resonance structure (that is, the transflective layer 326), when the white display is performed, a brightness of 250 Cd/m$^2$ and the amount of light of 3.511 m/W are obtained, which results in the great lowering of luminous efficiency.

Furthermore, in this embodiment, the transflective layer 326 having relatively lower reflectance (occupation area) is provided in the red (R) pixel. However, the transflective layer 326 may not be provided in the red (R) pixel. That is, the transflective layers 326 may be selectively provided only in the green (G) and blue (B) pixels.

Moreover, in order to make the reflectances of the transflective layers 326 in the respective color pixels different from each other, the transflective layer 326 may have a different thickness for every pixel. More specifically, it is preferable that the transflective layer 326 be formed so as to satisfy the following thickness relationship: the thickness of the red pixel<the thickness of the green pixel<the thickness of the blue pixel.

Next, a method of manufacturing the organic EL device 201 of the fourth embodiment will be described.

First, after the light-shielding layer BM is formed with a thickness of about 300 nm on the substrate 202 by the well-known photolithography technique, the base protecting film 202$c$ and the TFT 323 are formed, and the interlayer insulating films 344$a$ and 344$b$ are formed, thereby forming a base substrate of an EL device.

Then, aluminum is coated with a thickness of 10 nm on the second interlayer insulating film 344$b$ to form the transflective layer 326, and the transflective layer 326 is patterned to have the above-mentioned occupation area range.

Subsequently, ITO is formed with a thickness of about 70 nm in a pattern on all pixels to form a transparent anode, and $SiO_2$ is formed in a pattern with a thickness of about 50 nm to form the inorganic bank layer 312$a$, which is a pixel aperture film. In addition, polyimide is formed in a pattern with a thickness of about 2 μm to form the organic bank layer 312b.

Then, a liquid composite containing a PEDOT/PSS material is applied in regions surrounded by the formed bank portions by the inkjet method to form the hole injecting/transporting layer, such that it is formed with the same thickness of 50 nm in all pixels.

In addition, a polymer light-emitting material is formed in the R, G, and B pixels by the inkjet method. In this case, the polymer light-emitting material is formed with a thickness of 80 nm in the red and green pixels and a thickness of 70 nm in the blue pixel. Successively, the cathode 12 is formed, and then a sealing process is performed thereon, thereby obtaining the organic EL device 201 of the fourth embodiment.

Fifth Embodiment

Figure 10:
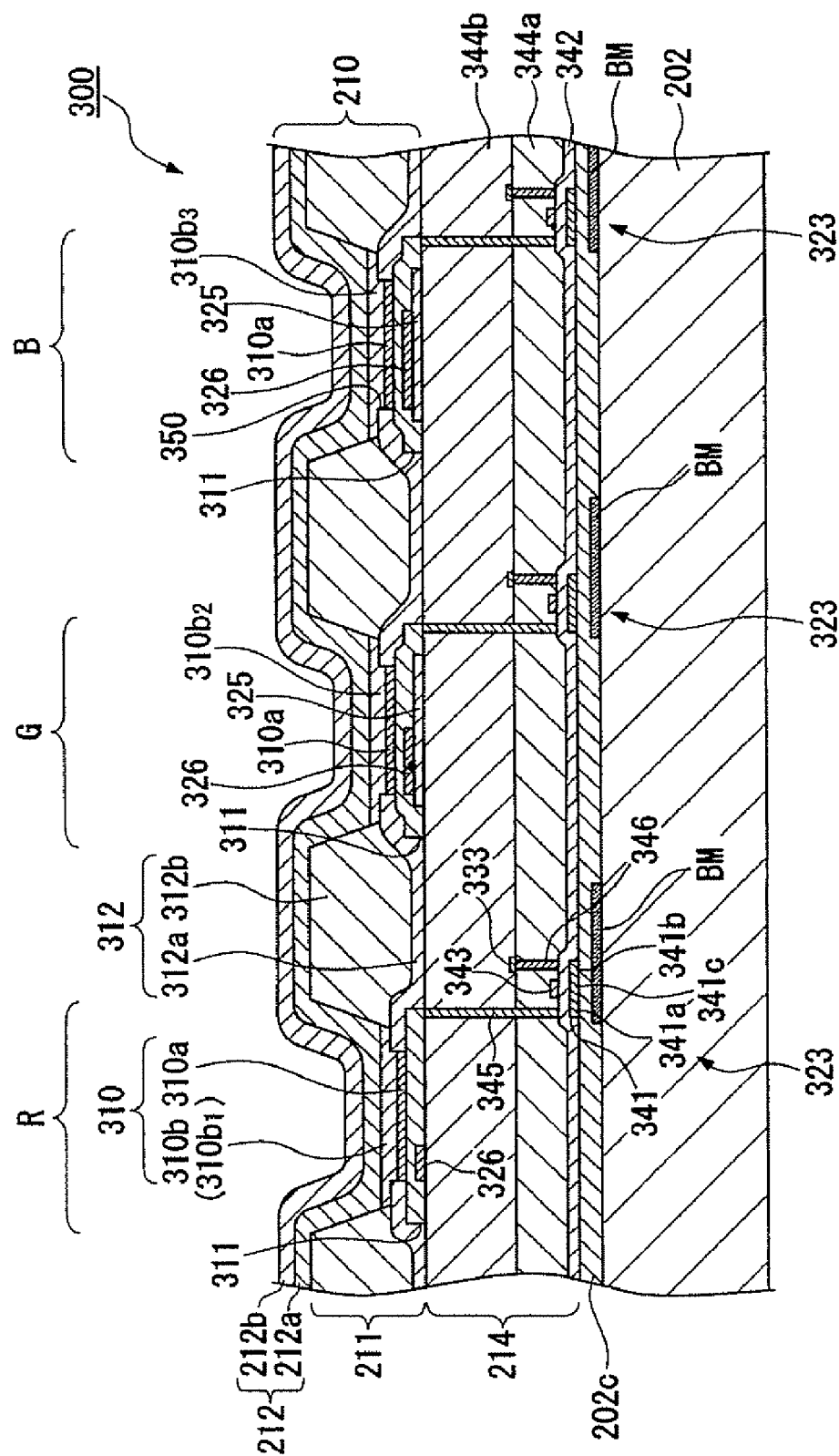
FIG. 10 is an enlarged view illustrating the sectional structure of a display region of an organic EL device according to a fifth embodiment.

Next, an organic EL device according to a fifth embodiment will be described with reference to FIG. 10. In an organic EL device 300 according to the fifth embodiment, red absorption filters 325 for absorbing red light are respectively formed at the light emission sides of the transflective layers 326 in the green (G) and blue (B) pixels, in addition to the structure of the fourth embodiment. The fifth embodiment has the same structure as the fourth embodiment except that the red absorption filters 325 are formed. Thus, in this embodiment, the description of the same structure as the fourth embodiment will be omitted.

The introduction of such a red absorption filter 325 makes it possible to improve color purity and to reduce the reflectance of external light. As a result, it is possible to construct a display device having a high level of visibility using the organic EL device 300. In addition, in order to prevent the reflection of external light, a well-known circularly polarizing plate may be provided on the light emission side of the substrate 202. Further, in the fifth embodiment, the ratio of occupation areas of the transflective layer 326 in the respective pixels is set to establish the following relationship: (the occupation area of the red pixel):(the occupation area of the green pixel):(the occupation area of the blue pixel)=10:40:50. Therefore, in this embodiment, the reflectance ratio of the transflective layers 326 in the respective pixels are set to establish the following relationship: (the reflectance of the transflective layer of the red pixel):(the reflectance of the transflective layer of the green pixel):(the reflectance of the transflective layer of the blue pixel)=10:40:50.

In this embodiment, the red absorption filter 325 may be formed of a resin layer made of for example, an Sn phthalocyanine composite. In addition, the red absorption filters 325 can be selectively provided in the green (G) and blue (B) pixels by the inkjet method or photolithography method. More specifically, when the inkjet method is used, $CF_4$ plasma is applied on the entire surface of the second interlayer insulating film 344b, and ultraviolet rays are irradiated onto the green (G) and blue (B) pixels to change the surface properties thereof, thereby forming a uniform film.

Sixth Embodiment

Figure 11:
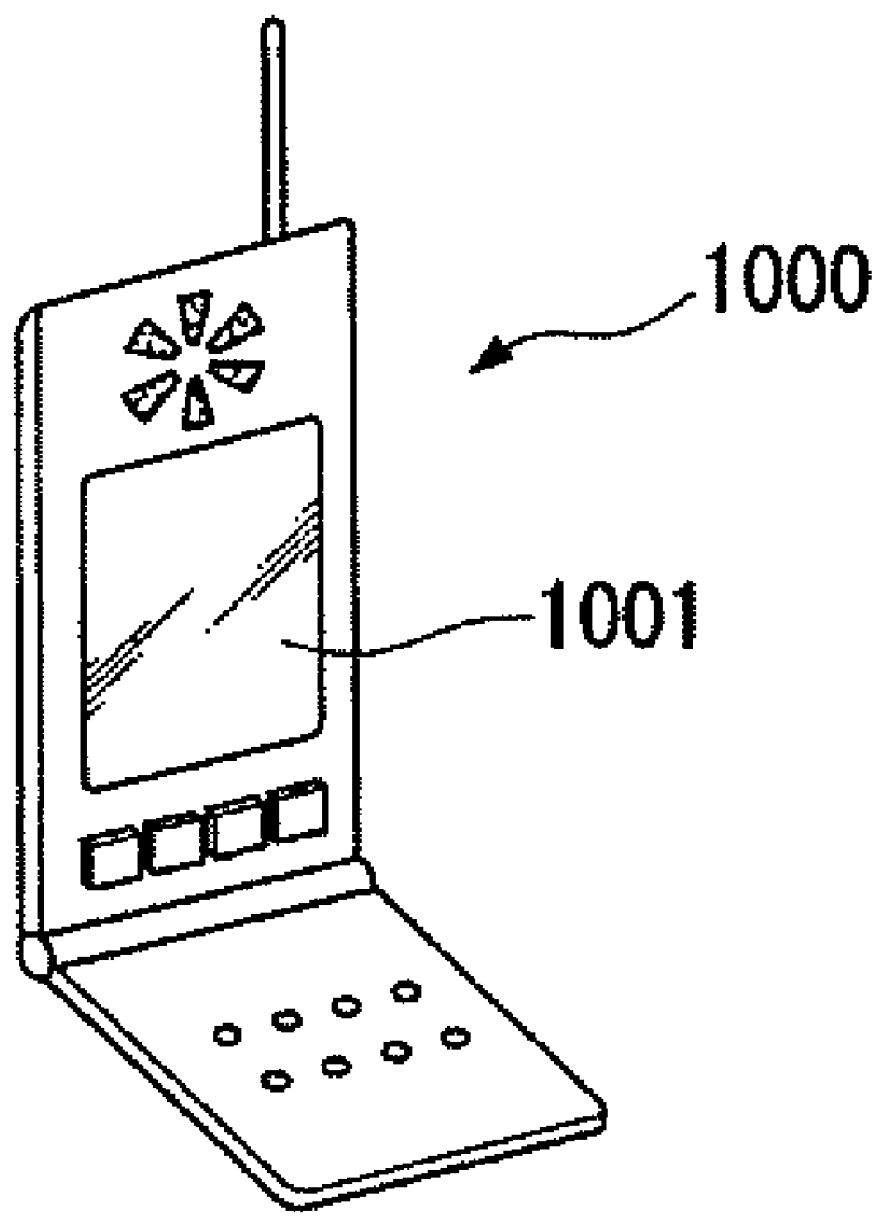
FIG. 11 is a perspective view illustrating an electronic apparatus according to a sixth embodiment of the invention.

FIG. 11 shows an electronic apparatus according to this embodiment of the invention.

The electronic apparatus of this embodiment has the above-mentioned organic EL device as a display unit. FIG. 11 is a perspective view illustrating an example of a cellular phone. In FIG. 11, reference numeral 1000 denotes a main body of the cellular phone, and reference numeral 1001 denotes a display unit using the organic EL device. As such, the electronic apparatus having the organic EL device, which is an electro-optical device according to the invention, as a display unit can have excellent luminous characteristics and low manufacturing costs.

The preferred embodiments of the invention have been described above, but the invention is not limited thereto. That is, various modifications and changes of the invention can be made without deviating from the spirit and scope of the invention. The invention is not limited by the above-mentioned description, but is limited by only the appended claims.

What is claimed is:

1. An organic EL device comprising:
   a substrate;
   a first light-transmissive electrode formed on or above the substrate;
   a second electrode formed above the substrate and the first electrode;
   a light-emitting layer arranged between the first light-transmissive electrode and the second electrode, light emitting from the light-emitting layer being emitted from a substrate side;
   a light absorption filter that absorbs part of the light emitted from the light-emitting layer that has passed through the first light-transmissive electrode; and
   a transflective layer arranged between the light absorption filter and the first light-transmissive electrode,
   wherein the light absorption filter is arranged between the first light-transmissive electrode and the substrate.

2. The organic EL device of claim 1, further comprising:
   a plurality of the first light-transmissive electrodes formed on or above the substrate; and
   insulation banks arranged between the plurality of first light-transmissive electrodes and formed over edge portions of the first light-transmissive electrodes,
   the light absorption filter being formed near the edge portions of the first light-transmissive electrodes covered by the banks in plan view.

3. The organic EL device of claim 2, further comprising:
   transistors connected to the first light transmissive electrodes; and
   light-shielding layers arranged under the transistors,
   the transistors and the banks being formed so as to overlap in plan view.

4. The organic EL device of claim 1, the transflective layer being covered by the light absorption filter as viewed from the substrate side.

5. The organic EL device of claim 2, further comprising:
   a portion of the banks being formed between edge portions of the light-emitting layer and the edge portions of the first light-transmissive electrodes.

6. The organic EL device of claim 2, the banks overlapping edge portions of the light absorption filter in plan view.

7. The organic EL device of claim 2, the light absorption filter being formed in between the edge portions.

* * * * *